(12) United States Patent
Yamazaki et al.

(10) Patent No.: US 8,178,880 B2
(45) Date of Patent: *May 15, 2012

(54) SEMICONDUCTOR DEVICE AND METHOD OF FABRICATING THE SAME

(75) Inventors: Shunpei Yamazaki, Tokyo (JP); Yasuyuki Arai, Kanagawa-ken (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/837,117

(22) Filed: Jul. 15, 2010

(65) Prior Publication Data

US 2010/0276696 A1    Nov. 4, 2010

Related U.S. Application Data

(60) Continuation of application No. 12/485,958, filed on Jun. 17, 2009, now Pat. No. 7,781,770, which is a division of application No. 11/460,105, filed on Jul. 26, 2006, now Pat. No. 7,560,732, which is a continuation of application No. 10/424,793, filed on Apr. 29, 2003, now Pat. No. 7,084,019, which is a division of application No. 09/840,641, filed on Apr. 24, 2001, now Pat. No. 6,580,475.

(30) Foreign Application Priority Data

Apr. 27, 2000   (JP) .................... 2000-128536

(51) Int. Cl.
    *H01L 27/14*   (2006.01)
(52) U.S. Cl. .............. 257/59; 257/72; 257/E27.131; 349/38; 349/43; 349/46

(58) Field of Classification Search ............ 257/59, 257/72, E27.131; 349/38, 43, 46
See application file for complete search history.

(56) References Cited

U.S. PATENT DOCUMENTS

| 4,470,667 A | 9/1984 | Okubo et al. |
| 5,153,685 A | 10/1992 | Murata et al. |
| 5,200,846 A | 4/1993 | Hiroki et al. |
| 5,287,205 A | 2/1994 | Yamazaki et al. |

(Continued)

FOREIGN PATENT DOCUMENTS

EP    0 932 137 A1    7/1999

(Continued)

OTHER PUBLICATIONS

U.S. Amendment (U.S. Appl. No. 10/959,056), 20 pages, filed Jun. 3, 2008.

(Continued)

*Primary Examiner* — Minh-Loan T Tran
(74) *Attorney, Agent, or Firm* — Fish & Richardson P.C.

(57) ABSTRACT

An active matrix display device having a pixel structure in which pixel electrodes, gate wirings and source wirings are suitably arranged in the pixel portions to realize a high numerical aperture without increasing the number of masks or the number of steps. The device comprises a gate electrode and a source wiring on an insulating surface, a first insulating layer on the gate electrode and on the source wiring, a semiconductor layer on the first insulating film, a second insulating layer on the semiconductor film, a gate wiring connected to the gate electrode on the second insulating layer, a connection electrode for connecting the source wiring and the semiconductor layer together, and a pixel electrode connected to the semiconductor layer.

31 Claims, 16 Drawing Sheets

U.S. PATENT DOCUMENTS

| | | | |
|---|---|---|---|
| 5,373,377 | A | 12/1994 | Ogawa et al. |
| 5,453,856 | A | 9/1995 | Kim |
| 5,493,429 | A | 2/1996 | Kanemoto et al. |
| 5,576,858 | A | 11/1996 | Ukai et al. |
| 5,637,380 | A | 6/1997 | Kaneko et al. |
| 5,643,826 | A | 7/1997 | Ohtani et al. |
| 5,680,187 | A | 10/1997 | Nagayama et al. |
| 5,757,451 | A | 5/1998 | Miyazaki et al. |
| 5,767,924 | A | 6/1998 | Hiroki et al. |
| 5,777,701 | A | 7/1998 | Zhang |
| 5,815,226 | A | 9/1998 | Yamazaki et al. |
| 5,867,233 | A | 2/1999 | Tanaka |
| 5,923,962 | A | 7/1999 | Ohtani et al. |
| 5,986,738 | A | 11/1999 | Tagusa et al. |
| 5,990,542 | A | 11/1999 | Yamazaki |
| 6,002,463 | A | 12/1999 | Fujikawa |
| 6,031,290 | A | 2/2000 | Miyazaki et al. |
| 6,104,461 | A | 8/2000 | Zhang et al. |
| 6,114,715 | A | 9/2000 | Hamada |
| 6,118,506 | A | 9/2000 | Yamazaki et al. |
| 6,144,082 | A | 11/2000 | Yamazaki et al. |
| 6,147,738 | A | 11/2000 | Okamoto |
| 6,175,395 | B1 | 1/2001 | Yamazaki et al. |
| 6,184,946 | B1 | 2/2001 | Ando et al. |
| 6,194,837 | B1 | 2/2001 | Ozawa |
| 6,208,395 | B1 | 3/2001 | Kanoh et al. |
| 6,266,121 | B1 | 7/2001 | Shigeta et al. |
| 6,300,926 | B1 | 10/2001 | Yoneya et al. |
| 6,303,963 | B1 | 10/2001 | Ohtani et al. |
| 6,339,459 | B1 | 1/2002 | Ichikawa et al. |
| 6,373,546 | B1 | 4/2002 | Kim |
| 6,384,808 | B2 | 5/2002 | Azami |
| 6,432,755 | B2 | 8/2002 | Sung et al. |
| 6,436,815 | B1 | 8/2002 | Yamazaki et al. |
| 6,441,468 | B1 | 8/2002 | Yamazaki |
| 6,445,059 | B1 | 9/2002 | Yamazaki |
| 6,461,899 | B1 | 10/2002 | Kitakado et al. |
| 6,469,317 | B1 | 10/2002 | Yamazaki et al. |
| 6,489,222 | B2 | 12/2002 | Yoshimoto |
| 6,501,098 | B2 | 12/2002 | Yamazaki |
| 6,524,877 | B1 | 2/2003 | Nakazawa et al. |
| 6,545,359 | B1 | 4/2003 | Ohtani et al. |
| 6,545,424 | B2 | 4/2003 | Ozawa |
| 6,552,764 | B2 | 4/2003 | Fujioka et al. |
| 6,567,067 | B2 | 5/2003 | Azami |
| 6,580,475 | B2 * | 6/2003 | Yamazaki et al. ............... 349/43 |
| 6,583,472 | B1 | 6/2003 | Shibata et al. |
| 6,657,260 | B2 | 12/2003 | Yamazaki et al. |
| 6,671,025 | B1 | 12/2003 | Ikeda et al. |
| 6,690,033 | B2 | 2/2004 | Yamazaki et al. |
| 6,690,437 | B2 | 2/2004 | Yamazaki et al. |
| 6,771,346 | B2 | 8/2004 | Sugimoto et al. |
| 6,787,887 | B2 | 9/2004 | Yamazaki |
| 6,789,910 | B2 | 9/2004 | Kimura et al. |
| 6,825,488 | B2 | 11/2004 | Yamazaki et al. |
| 6,888,160 | B1 | 5/2005 | Nakajima et al. |
| 7,023,021 | B2 | 4/2006 | Yamazaki et al. |
| 7,034,381 | B2 | 4/2006 | Yamazaki |
| 7,084,019 | B2 | 8/2006 | Yamazaki et al. |
| 7,098,086 | B2 | 8/2006 | Shibata et al. |
| 7,202,551 | B2 | 4/2007 | Yamazaki |
| 7,413,937 | B2 | 8/2008 | Yamazaki |
| 7,560,732 | B2 * | 7/2009 | Yamazaki et al. ............... 257/59 |
| 7,781,770 | B2 | 8/2010 | Yamazaki et al. |
| 2001/0004273 | A1 | 6/2001 | Sugimoto et al. |
| 2001/0025959 | A1 | 10/2001 | Yamazaki et al. |
| 2001/0030322 | A1 | 10/2001 | Yamazaki et al. |
| 2001/0040655 | A1 | 11/2001 | Yamazaki et al. |
| 2002/0001887 | A1 | 1/2002 | Sung et al. |
| 2002/0017645 | A1 | 2/2002 | Yamazaki et al. |
| 2002/0110941 | A1 | 8/2002 | Yamazaki et al. |
| 2002/0158288 | A1 | 10/2002 | Yamazaki et al. |
| 2004/0126945 | A1 | 7/2004 | Shibata et al. |
| 2005/0056848 | A1 | 3/2005 | Yamazaki et al. |
| 2007/0184665 | A1 | 8/2007 | Yamazaki et al. |

FOREIGN PATENT DOCUMENTS

| | | |
|---|---|---|
| EP | 0 935 157 A | 8/1999 |
| EP | 1 008 893 A1 | 6/2000 |
| EP | 1128430 A2 | 8/2001 |
| EP | 1 505 649 A2 | 2/2005 |
| JP | 1101519 U | 4/1989 |
| JP | 2287303 A | 11/1990 |
| JP | 04-313729 A | 11/1992 |
| JP | 6148685 A | 5/1994 |
| JP | 06-175158 A | 6/1994 |
| JP | 06-324350 A | 11/1994 |
| JP | 7235680 A | 9/1995 |
| JP | 8274336 A | 10/1996 |
| JP | 9160509 A | 6/1997 |
| JP | 09-223804 A | 8/1997 |
| JP | 1048640 C | 2/1998 |
| JP | 10073813 A | 3/1998 |
| JP | 10197712 A | 7/1998 |
| JP | 10-282505 A | 10/1998 |
| JP | 10-319431 A | 12/1998 |
| JP | 11-024604 A | 1/1999 |
| JP | 11-223827 A | 8/1999 |
| JP | 11-231805 A | 8/1999 |
| JP | 2002-014628 A | 1/2002 |
| WO | 98/23995 A1 | 6/1998 |

OTHER PUBLICATIONS

U.S. Amendment (U.S. Appl. No. 09/848,642), 14 pages, filed Jul. 2, 2008.

* cited by examiner

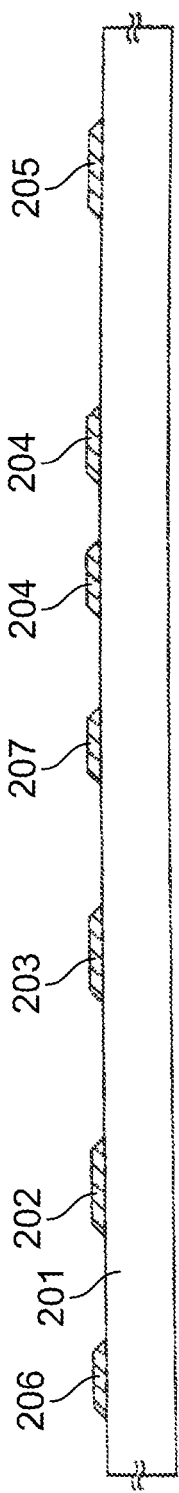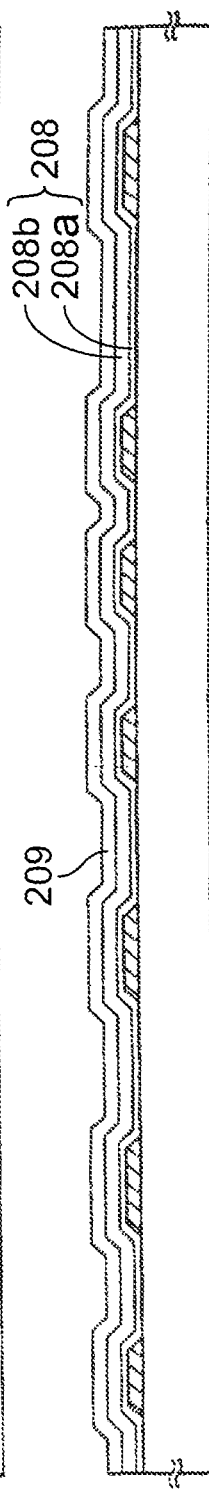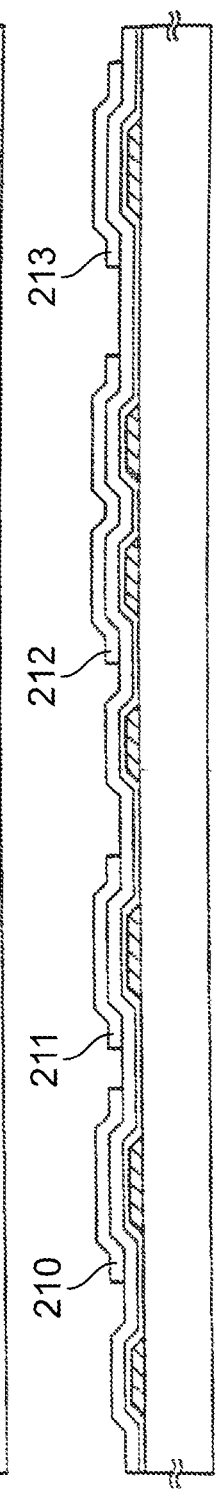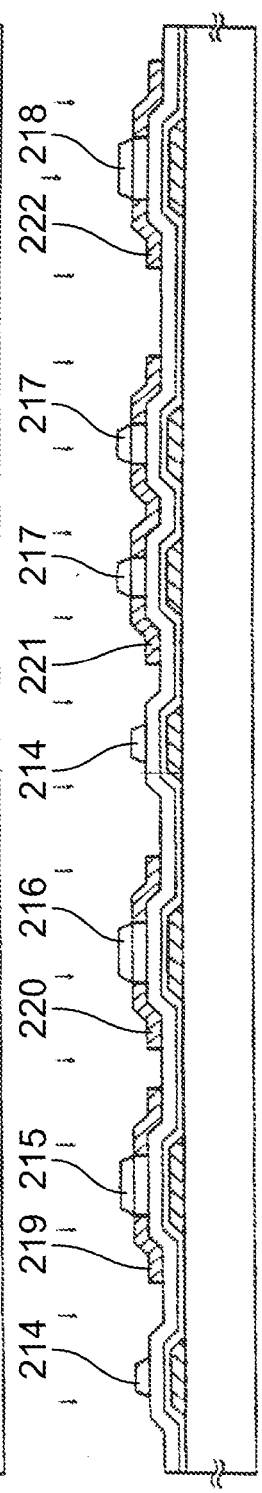

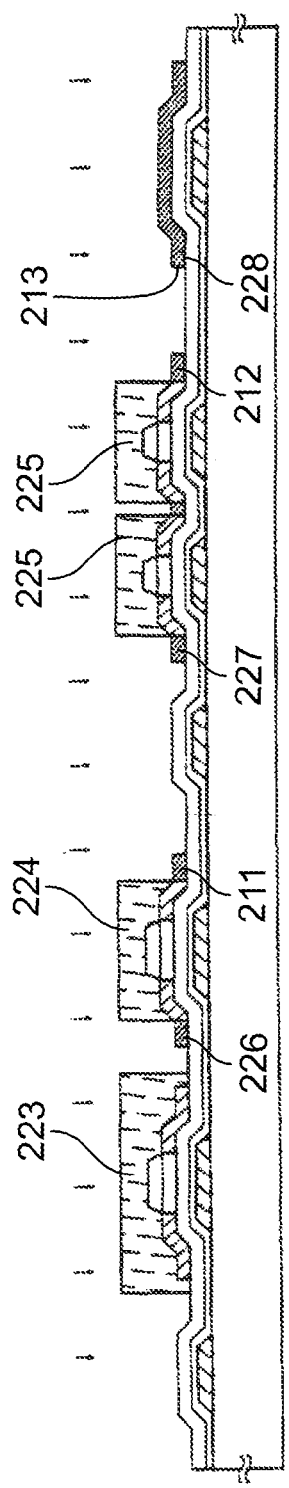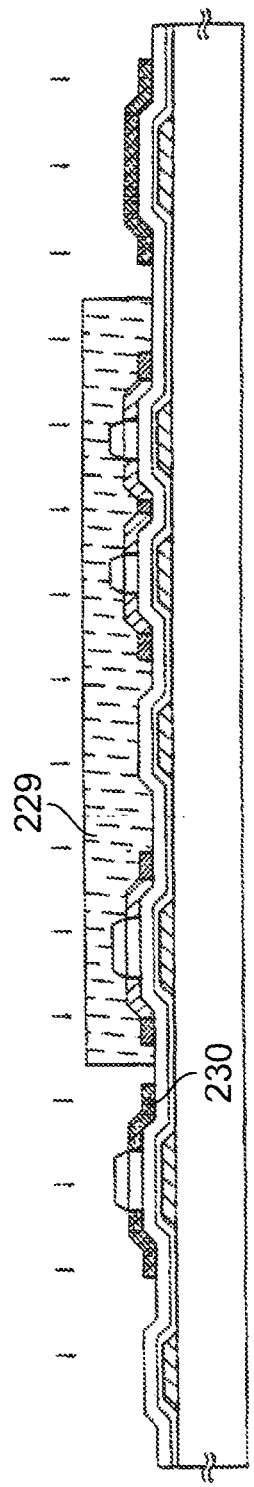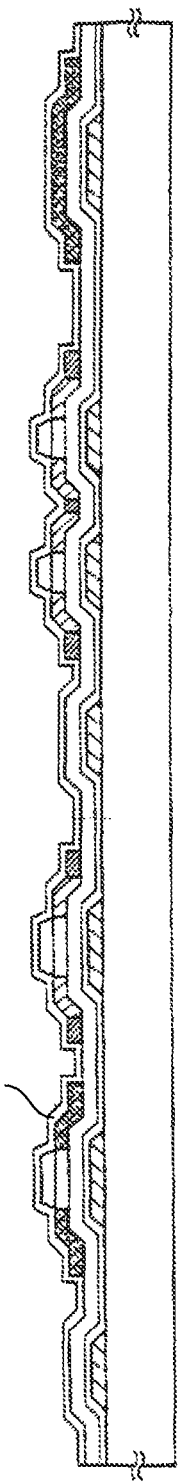
FIG. 5(A)
FIG. 5(B)
FIG. 5(C)

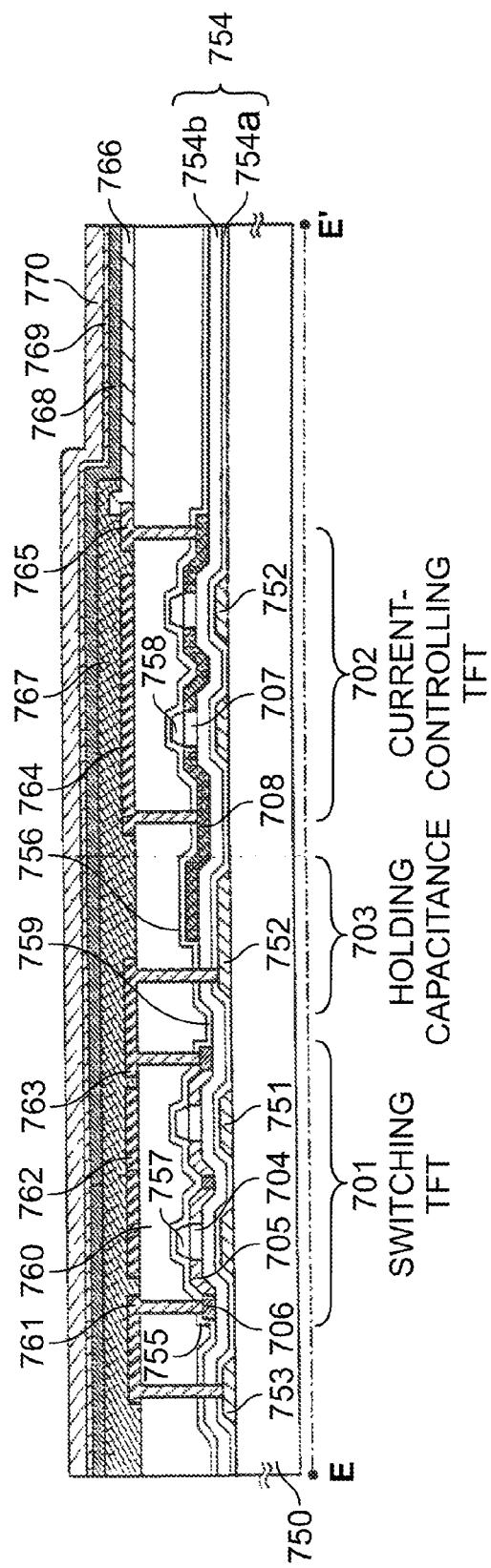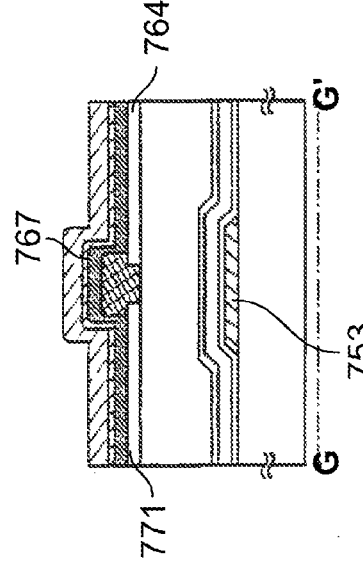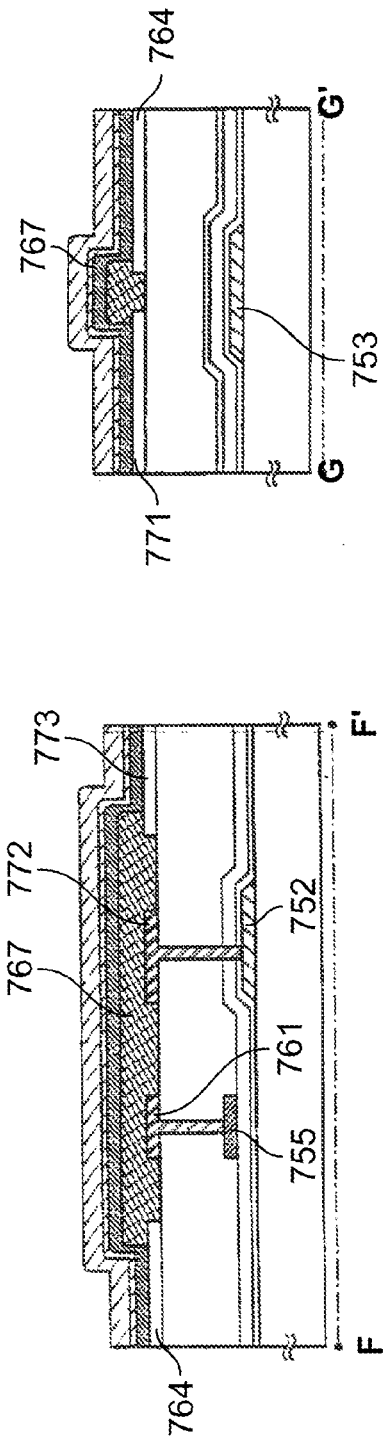
FIG. 13(A)
FIG. 13(C)
FIG. 13(B)

SEMICONDUCTOR DEVICE AND METHOD OF FABRICATING THE SAME

CROSS-REFERENCE TO RELATED APPLICATIONS

This application is a continuation of U.S. application Ser. No. 12/485,958, filed Jun. 17, 2009, now allowed, which is a divisional of U.S. application Ser. No. 11/460,105, filed Jul. 26, 2006, now U.S. Pat. No. 7,560,732, which is a continuation of U.S. application Ser. No. 10/424,793, filed Apr. 29, 2003, now U.S. Pat. No. 7,084,019, which is a divisional of U.S. application Ser. No. 09/840,641, filed Apr. 24, 2001, now U.S. Pat. No. 6,580,475, which claims the benefit of a foreign priority application filed in Japan as Serial No. 2000-128536 on Apr. 27, 2000, all of which are incorporated by reference.

BACKGROUND OF THE INVENTION

1. Field of the Invention

This invention relates to a semiconductor device having an integrated circuit constituted by thin-film transistors (hereinafter referred to as TFTs) and to a method of fabricating the same. The invention relates to, for example, an electro-optical device as represented a liquid crystal display panel and an electronic device mounting the electro-optical device as a part. In this specification, the semiconductor device generally stands for such devices that function by utilizing the semiconductor properties. Therefore, electro-optical devices, semiconductor circuits and electronic devices are all encompassed by the scope of the semiconductor device.

2. Related Art

Technology has been developed for fabricating thin-film transistors (TFTs) by using a thin semiconductor film (of a thickness of from about several nanometers to about several hundred nanometers). TFTs have been put into practical use as switching elements of the liquid crystal display devices and, in recent years, it is becoming possible to form a CMOS circuit and an integrated circuit on a substrate such as of a glass.

Active matrix liquid crystal display devices are becoming a main stream of liquid crystal display devices, by arranging a pixel electrodes in the form of a matrix and by using TFTs as switching elements connected to the pixel electrodes, in order to meet the demand for realizing a highly fine picture quality. The active matrix liquid crystal display devices can be roughly divided into two; i.e., those of the transmission type and those of the reflection type. In particular, the liquid crystal display device of the reflection type, which does not use back light, has a merit that it consumes electric power in smaller amounts than the transmission-type liquid crystal display device, and is finding an increasing demand as a direct view-type display device for portable data terminals and video cameras.

The active matrix liquid crystal display device of the reflection type selects a state where an incident beam is reflected by a pixel electrode and is output to the outer side of the device and a state where the incident beam is not output to the outer side of the device by utilizing the optical modulation action of the liquid crystals, produces a bright display and a dark display, and, further, combines these displays to display a picture. In general, pixel electrodes in the liquid crystal display device of the reflection type are formed of an electrically conducting material having a high optical reflection factor such as of aluminum or silver.

In any way, the size of each pixel becomes inevitably more fine as the picture quality becomes more fine. As a result, the ratio of areas occupied by the TFT, source wiring and gate wiring increases in the pixel portion, and the numerical aperture decreases. In order to increase the numerical aperture of the pixels within a specified pixel size, therefore, it is essential to efficiently lay out the circuit elements necessary for constituting the pixel circuit.

SUMMARY OF THE INVENTION

This invention was derived in view of the above-mentioned problem, and has an object of providing an active matrix-type display device having a pixel structure in which a pixel electrode, a gate wiring and a source wiring are suitably arranged in a pixel portion, and which realizes a high numerical aperture without increasing the number of the masks or the number of the steps.

This invention has a structure in which TFTs are shut off the light without using a light-shielding film that forms a black matrix, and light leaking among the pixels is shutoff. The above structure of this invention comprises;
  a gate electrode and a source wiring over an insulating surface;
  a first insulating film over the gate electrode and over the source wiring;
  a semiconductor film over the first insulating film;
  a second insulating film over the semiconductor film;
  a gate wiring connected to the gate electrode over the second insulating film;
  a connection electrode for connecting the source wiring and the semiconductor film together; and
  a pixel electrode connected to the semiconductor film.

Another invention has a constitution which comprises:
  a first gate electrode, a second gate electrode and a source wiring over an insulating surface;
  a first insulating film over the first and second gate electrodes and over the source wiring;
  a first semiconductor film having a source region, a drain region and a channel-forming region over the first insulating film;
  a second semiconductor film overlapped over the second gate electrode;
  a second insulating film over the first and second semiconductor films;
  a gate wiring connected to the gate electrode over the second insulating film;
  a connection electrode for connecting the source wiring and the source region together; and
  a pixel electrode connected to the drain region and to the second semiconductor film.

In this constitution of the invention, the end on one side of the pixel electrode is formed on the source wiring so as to also serve as a light-shielding film, enabling the pixel electrode to occupy an increased area in the pixel unit.

A further invention has a constitution which comprises:
  a first step of forming a gate electrode and a source wiring over an insulating surface;
  a second step of forming a first insulating film over the gate electrode;
  a third step of forming a semiconductor film over the first insulating film;
  a fourth step of forming a second insulating film over the semiconductor film; and
  a fifth step of forming, over the second insulating film, a gate wiring connected to the gate electrode, a connection electrode for connecting the source wiring and the semiconductor film together, and a pixel electrode connected to the semiconductor film.

A further invention has a constitution which comprises:

a first step of forming a gate electrode and a source wiring over an insulating surface;

a second step of forming a first insulating film over the gate electrode;

a third step of forming a semiconductor film over the first insulating film;

a fourth step of forming a source region and a drain region over the semiconductor film;

a fifth step of forming a second insulating film over the semiconductor film; and a sixth step of forming, over the second insulating film, a gate wiring connected to the gate electrode, a connection electrode for connecting the source wiring and the source region together, and a pixel electrode connected to the drain region.

A further invention has a constitution which comprises:

a first step of forming a first gate electrode, a second gate electrode and a source wiring over an insulating surface;

a second step of forming a first insulating film over the first and second gate electrodes;

a third step of forming, over the first insulating film, a first semiconductor film that overlaps over the first gate electrode and a second semiconductor film that overlaps over the second gate electrode;

a fourth step of forming a source region and a drain region in the first semiconductor film;

a fifth step of forming a second insulating film over the semiconductor film; and a sixth step of forming, over the second insulating film, a gate wiring connected to the gate electrode, a connection electrode for connecting the source wiring and the source region together, and a pixel electrode for connecting the drain region and the second semiconductor film together.

According to the above steps, the end on one side of the pixel electrode is formed over the source wiring to form a pixel structure in which the source wiring also serves as a light-shielding film, enabling the pixel electrode to occupy an increased area in the pixel portion.

BRIEF DESCRIPTION OF THE DRAWINGS

FIGS. 4(A) to 4(D) are sectional views illustrating steps of fabricating the TFT in the drive circuit and the pixel TFT;

FIGS. 5(A) to 5(C) are sectional views illustrating steps of fabricating the TFT in the drive circuit and the pixel TFT;

FIGS. 13(A) to 13(C) are sectional views illustrating the constitution of the pixel portion in an EL display device;

DESCRIPTION OF THE PREFERRED EMBODIMENTS

Figure 1:
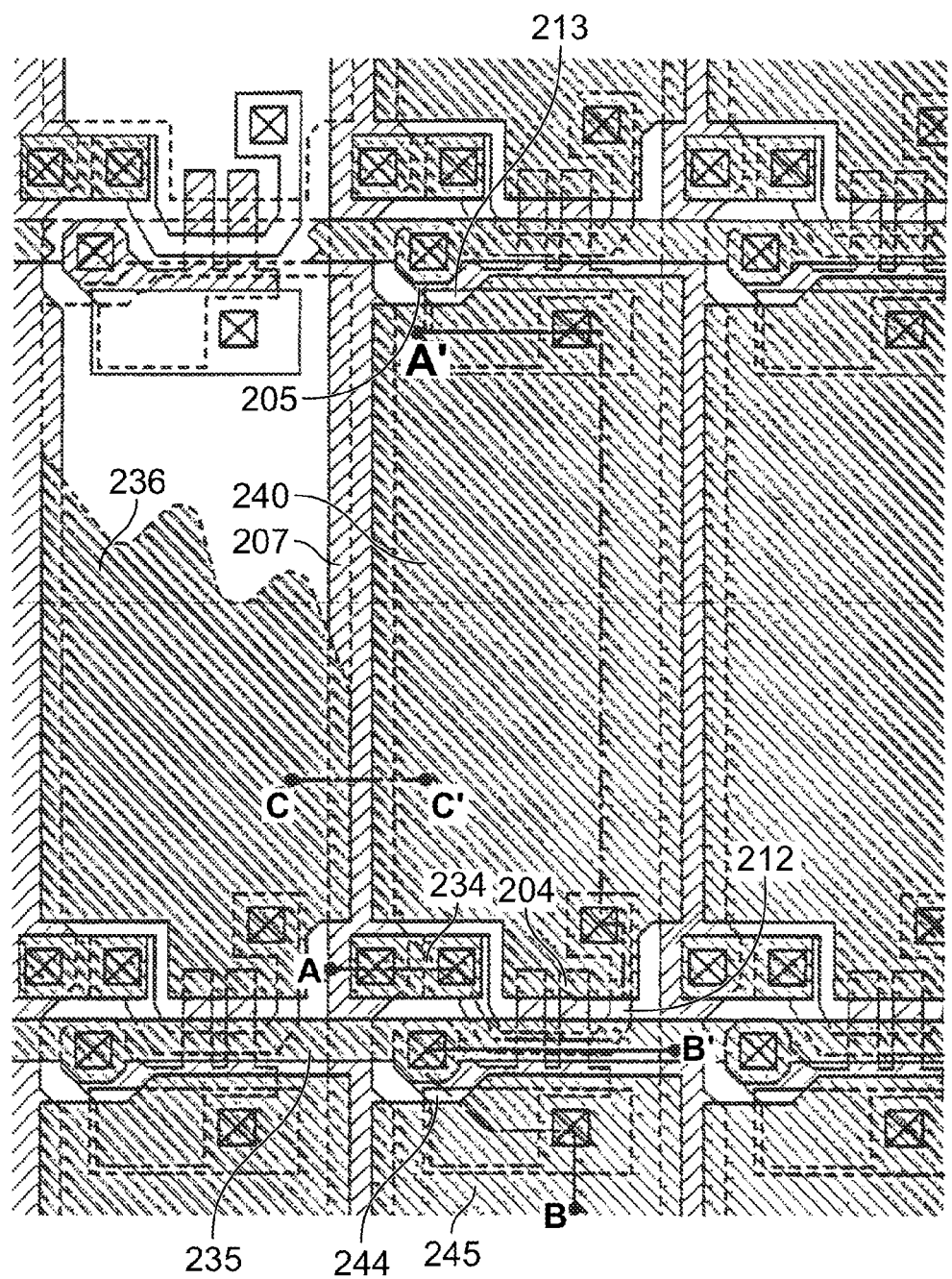
FIG. 1 is a top view illustrating the constitution of a pixel in a liquid crystal display device of this invention.

Referring to FIG. 1, a pixel structure in the active matrix liquid crystal display device is constituted by a gate wiring 235 arranged in a direction of the row, a source wiring 207 arranged in a direction of the column, a pixel TFT provided at a portion where the gate wiring and the source wiring intersect each other, and a pixel electrode connected to the pixel TFT.

A gate electrode 204 of a TFT provided for every pixel (hereinafter referred to as pixel TFT) is formed on an insulating surface, and a semiconductor film 212 is formed via a first insulating film. The source wiring 207 is formed on the same insulating surface as that of the gate electrode 204. The gate wiring 235 and a pixel electrode 236 are formed on a second insulating film formed on the semiconductor film 212. The gate wiring 235 and the pixel electrode 236 are connected to the gate electrode 204 and to the semiconductor film 212, respectively, through contact holes. Further, the source wiring 207 and the semiconductor film 212 are connected together through a connection wiring 234 formed on the same layer as the gate wiring 235.

Due to this pixel structure, a portion where the semiconductor film 212 intersects the gate electrode 204 (a portion where a channel is formed in the TFT) can be covered with the gate wiring 235 so as to be shielded from the light. It is desired that other regions of the semiconductor film 212 are shielded from the light, too. In FIG. 1, the gate electrode is of a comb shape to illustrate a TFT structure where there exist plural channel-forming regions. It is, however, desired that even a region existing between a channel-forming region and another channel-forming region, too, is shielded from the light by the gate wiring 235.

In the pixel structure of FIG. 1, the gate electrode works as one electrode for forming a holding capacity in the pixel. A pixel is formed by the semiconductor film 212 and the pixel electrode 236 connected thereto. Here, the pixel electrode 236 is further connected to the semiconductor film 213. The semiconductor film 213 is formed as an electrode for forming a capacity, and forms a holding capacity together with the gate electrode 205. In this case, a p-type impurity (accepter) is added to the semiconductor film 213. In this constitution, the holding capacity is formed being overlapped on the pixel electrode 236.

Further, the end of the pixel electrode 236 on one side can be formed being overlapped on the source wiring 207 to shut off light that leaks through a gap to the neighboring pixel electrode 242.

A pattern of the above pixel structure can be formed by a process for exposure to light. The process for exposure to light requires photomasks, i.e., a first photomask for forming a gate electrode, a second photomask for forming a semiconductor film, a third photomask for forming an LDD region of the pixel TFT, a fourth photomask for forming a contact hole, and a fifth photomask for forming the gate wiring, pixel electrode and connection wiring. Namely, the pixel portion can be formed by using five pieces of photomasks. When a drive circuit is formed around the pixel portion by applying a CMOS circuit constituted by n-channel TFTs and p-channel TFTs, an additional photomask is needed for covering the n-channel TFTs. When the pixel structure shown in FIG. 1 is constituted as described above, there can be realized a reflection-type liquid crystal display device having a high pixel numerical aperture using a small number of masks.

The pixel structure shown in FIG. 1 is fabricated based on a prerequisite of being used for the reflection-type liquid crystal display device. However, if the transparent electrode is formed in a predetermined pattern by adding one more piece of photomask, it becomes possible to produce a liquid crystal display device of the transmission type, too. The thus constituted invention will be described in further detail by way of embodiments described below.

EMBODIMENTS

Embodiment 1

This embodiment deals with a method of simultaneously fabricating a pixel portion and TFTs (n-channel TFT and p-channel TFT) for forming a drive circuit around the pixel portion on the same substrate with reference to the drawings.

Referring, first, to FIG. 4(A), on a substrate 201 made of a glass such as barium borosilicate glass or alumino borosilicate glass as represented by a glass #7059 or #1737 of Corning Co., there are formed gate electrodes 202 to 204, source wirings 206, 207 and a capacitor wiring 205 for forming a holding capacity of a pixel portion of an electrically conducting film containing one or plural kinds of components selected, preferably, from molybdenum (Mo), tungsten (W) and tantalum (Ta). An alloy of Mo and W is desired from the standpoint of decreasing the resistance and enhancing the heat resistance. The gate electrodes may be formed by using aluminum while oxidizing the surface thereof.

The gate electrodes formed by using a first photomask has a thickness of 200 to 400 nm, preferably, 250 nm, and have ends that are tapered so that a film can be favorably formed thereon (to improve step coverage). The ends are tapered at an angle of 5 to 30 degrees and, preferably, 15 to 25 degrees. The ends are tapered by dry-etching and the angles are controlled relying on an etching gas and a bias voltage applied to the substrate side.

Referring next to FIG. 4(B), a first insulating film 208 is formed for covering the gate electrodes 202 to 204, source wirings 206, 207 and capacitor wiring 205 that forms a holding capacitor in the pixel portion. The first insulating film 208 is the one containing silicon and is formed maintaining a thickness of 40 to 200 nm by the plasma CVD method or the sputtering method. The first insulating film 208 is formed of, for example, a silicon nitride film 208a of a thickness of 50 nm and a silicon oxide film 208b of a thickness of 120 nm. It is further allowable to use a silicon oxinitride film ($SiO_xN_y$) formed of $SiH_4$, $N_2O$ and $NH_3$ by the plasma VD method.

The first insulating film 208 includes a semiconductor film formed as an upper layer thereof and is used as a gate-insulating film, and further exhibits a function of a blocking layer to prevent the diffusion of impurities such as of an alkali metal in the semiconductor film from the substrate 201.

The semiconductor film 209 is formed on the first insulating film 208 by using a polycrystalline semiconductor maintaining a thickness of 30 to 100 nm and, preferably, 40 to 60 nm. Though there is no limitation on the material of the polycrystalline semiconductor, there can be typically used silicon or a silicon-germanium (SiGe) alloy. The polycrystalline semiconductor is obtained by subjecting a semiconductor having an amorphous structure formed by the plasma CVD method or sputtering method to the crystallization relying upon a laser crystallization method or thermal crystallization method.

The polycrystalline semiconductor is formed by the laser crystallization method by using an excimer laser, a YAG laser, a $YVO_4$ laser or a YLF laser of the pulse oscillation type or of the continuous emission type. When these lasers are used, the laser beam emitted from the laser oscillator is linearly collected through an optical system and is projected onto the semiconductor film. The crystallization conditions can be suitably selected by a person who conducts the production. When the excimer laser is used, however, the pulse oscillation frequency is set to be 30 Hz and the laser energy density is selected to be 100 to 400 mJ/cm$^2$ (typically, 200 to 300 mJ/cm$^2$). When the YAG laser is used, the pulse oscillation frequency is set to be 1 to 10 kHz by using the second harmonics and the laser energy density is set to be 300 to 600 mJ/cm$^2$ (typically, 350 to 500 mJ/cm$^2$). A laser beam linearly focused into a width of 100 to 1000 μm and, for example, into 400 μm is projected onto the whole surface of the substrate at an overlapping ratio of the linear laser beam of 80 to 98%.

At this step, a p-type impurity (acceptor) as represented by boron may be added to the semiconductor film 209 at a concentration of $1\times10^{16}$ to $5\times10^{17}$/cm$^3$ in order to control the threshold voltage of the TFTs.

Figure 2:
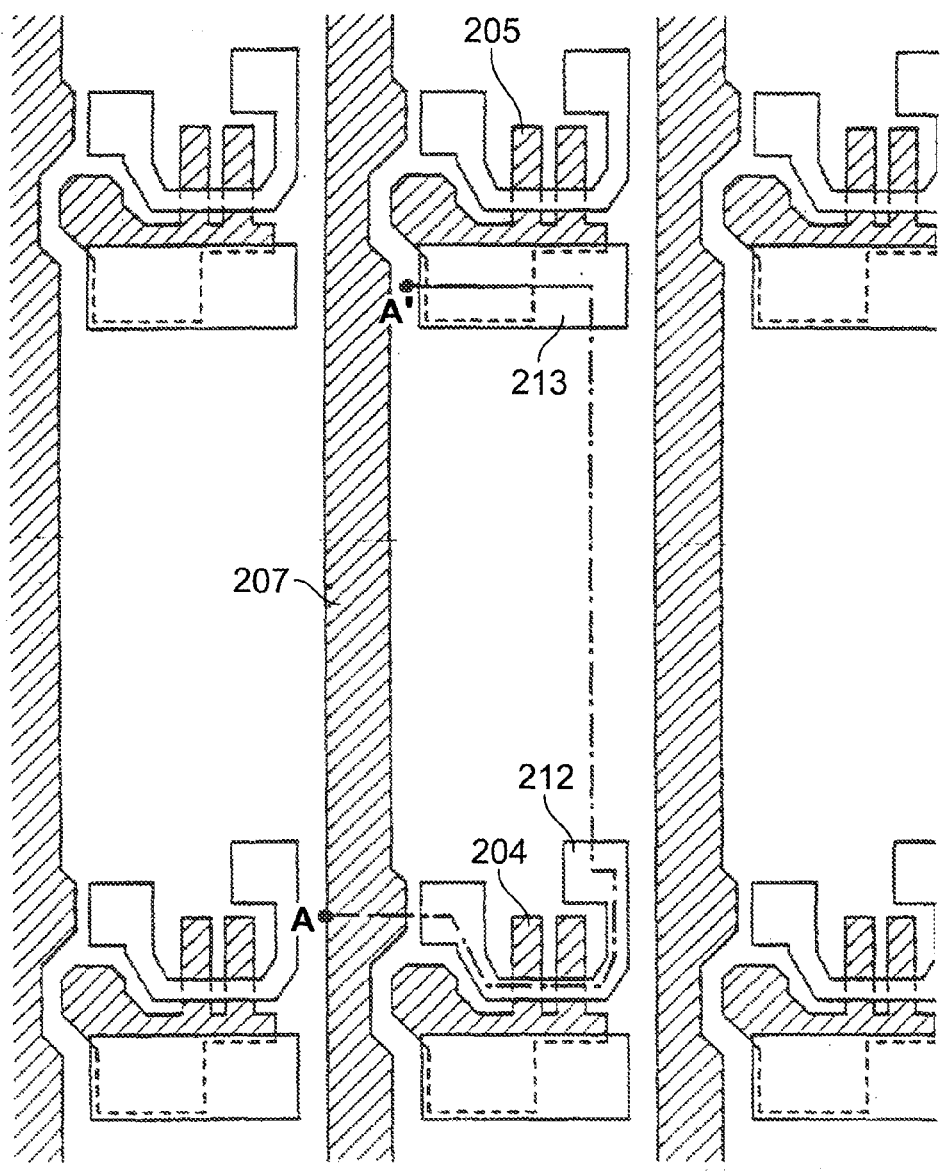
FIG. 2 is a top view illustrating a step of fabricating a TFT in a drive circuit and a pixel TFT.

The semiconductor film 209 of the polycrystalline semiconductor is formed in a predetermined pattern by using a second photomask. FIG. 4(C) illustrates semiconductor films 210 to 213 divided into islands. Semiconductor films 210 to 212 are so formed as will be partly overlapped on the gate electrodes 202 and 204. FIG. 2 is a top view of a pixel portion in this state, and FIG. 4(C) is a sectional view along the line A-A' of FIG. 2.

Thereafter, an insulating film of silicon oxide or silicon nitride is formed maintaining a thickness of 100 to 200 nm on the semiconductor films 210 to 213. Referring to FIG. 4(D), third insulating layers 214 to 218 that serve as channel protection films are formed on the semiconductor films 210 to 212 in a self-aligned manner by an exposure process from the back surface using the gate electrodes as a mask.

Then, a first doping step is effected to form an LDD (lightly doped drain) region of the n-channel TFT. The doping may be effected by the ion doping method or the ion injection method. Phosphorus (P) is added as the n-type impurity (donor), and first impurity regions 219 to 222 are formed by using the third insulating layers 215 to 218 as a mask. The donor concentration in these regions is $1\times10^{16}$ to $2\times10^{17}$/cm$^3$.

A second doping step is the one for forming a source region and a drain region of the n-channel TFT. Referring to FIG. 5(A), masks 223 to 225 are formed by the resist by using a third mask. The masks 224 and 225 are formed covering the LDD region of the n-channel TFT, and a donor impurity is added to the second impurity regions 226 to 228 at a concentration in a range of $1\times10^{20}$ to $1\times10^{21}$/cm$^3$.

Before or after the second doping step, it is desired that the etching is effected with a hydrofluoric acid in a state where the masks 223 to 225 are formed to remove the third insulating layers 214 and 218.

Referring to FIG. 5(B), the source region and the drain region of the p-channel TFT are formed by a third doping step; i.e., a p-type impurity (acceptor) is added by the ion doping method or the ion injection method to form third impurity regions 230 and 231. The p-type impurity concentration in these regions is $2 \times 10^{20}$ to $2 \times 10^{21}/cm^3$. In this step, the p-type impurity is added to the semiconductor film 213, too.

Referring, next, to FIG. 5(C), a second insulating film is formed on the semiconductor film. Preferably, the second insulating film is formed of plural insulating films. A first layer 232 of the second insulating film formed on the semiconductor film is an inorganic insulator of a hydrogen-containing silicon nitride film or a silicon oxinitride film and has a thickness of 50 to 200 nm. Thereafter, the impurities added to the semiconductor films are activated. This step is effected by a heat-annealing method using an annealing furnace. There can be further employed a laser annealing method or a rapid thermal annealing method (RTA method). The heat-annealing method is conducted in a nitrogen atmosphere at 400 to 600° C. and, typically, at 450 to 500° C. for 1 to 4 hours.

Due to this heat treatment, hydrogen is released from the silicon nitride film or the silicon oxinitride film which is the first layer 232 of the second insulating film simultaneously with the activation of the impurity element, and the semiconductor film is hydrogenated. This is a step to terminate the dangling bond of the semiconductor film with hydrogen. As means for efficiently executing the hydrogenation, there may be executed a plasma hydrogenation (using hydrogen excited by plasma) prior to forming the first layer 232 of the second insulating film.

Figure 6A:
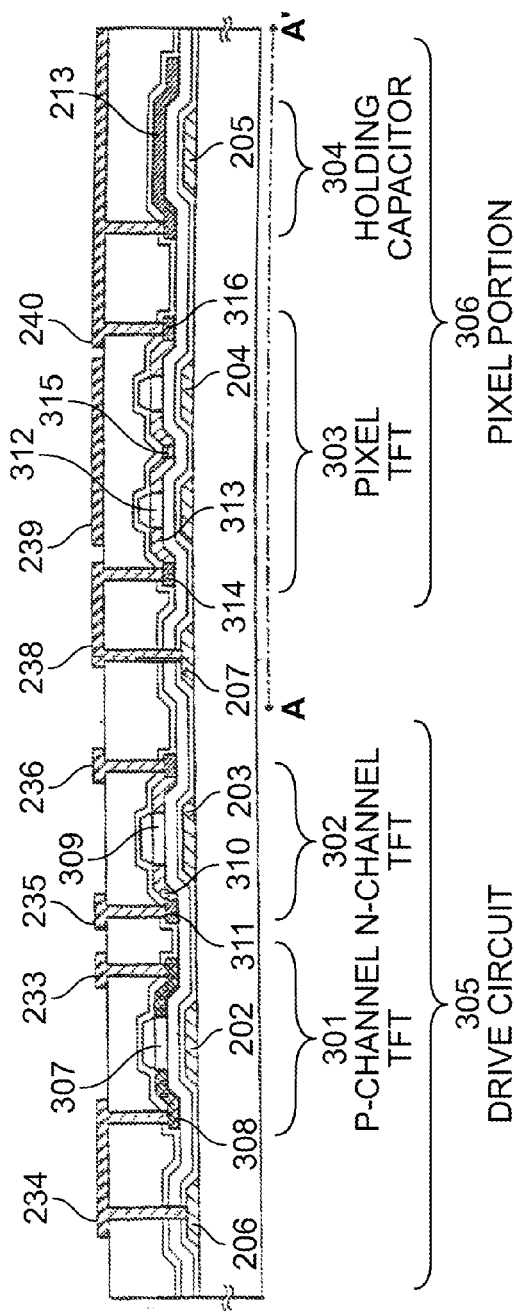
FIGS. 6(A) to 6(C) are sectional views illustrating a step of fabricating the TFT in the drive circuit and the pixel TFT.

A second layer 233 of the second insulating film shown in FIG. 6(A) is formed of an organic insulating material such as polyimide or acrylic material, and has a flat surface. It is, of course, allowable to form a silicon oxide film of TEOS (tetraethyl orthosilicate) by the plasma CVD method. From the standpoint of enhancing the flatness, however, it is desired to use the above organic material.

Then, contact holes are formed by using a fifth photomask. There are further formed a connection electrode 234 and source or drain wirings 235, 236 in the drive circuit 305 by using aluminum (Al), titanium (Ti) or tantalum (Ta) using a sixth photomask. There are further formed a pixel electrode 240, a gate wiring 239 and a connection electrode 238 in a pixel portion 306.

Thus, there are formed on the same substrate the drive circuit 305 having a p-channel TFT 301 and an n-channel TFT 302, and the pixel portion 306 having a pixel TFT 303 and a holding capacitor 304. In the p-channel TFT 301 in the drive circuit 305, there are formed a channel-forming region 307 and a source or drain region 308 which is a third impurity region. In the n-channel TFT 302, there are formed a channel-forming region 309, an LDD region 310 which is a first impurity region, and a source or drain region 311 which is a second impurity region. The pixel TFT 303 in the pixel portion 306 is of a multi-gate structure, and in which are formed a channel-forming region 312, an LDD region 313, and source or drain regions 314 and 316. The second impurity region located between the LDD regions 313 is effective in lowering the off current. A holding capacitor 304 is formed by the capacitor wiring 205, the semiconductor film 213 and the first insulating film formed therebetween.

In the pixel portion 306, the source wiring 207 is electrically connected through a connection electrode 238 to the source or drain region 314 of the pixel TFT 303. Further, the gate wiring 239 is electrically connected to the first electrode. The pixel electrode 240 is connected to the source or drain region 316 of the pixel TFT 303 and to the semiconductor film 213 of the holding capacitor 304.

Figure 3:
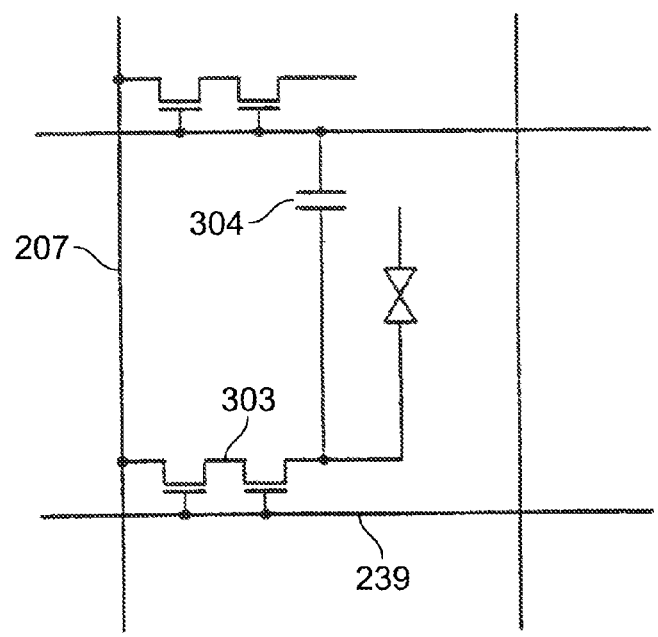
FIG. 3 is a circuit diagram illustrating the constitution of the pixel in the liquid crystal display device.
Figure 6C:
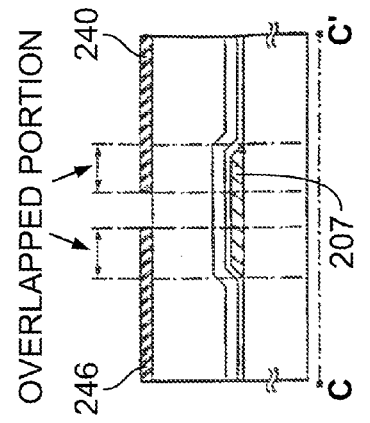
Figure 6B:
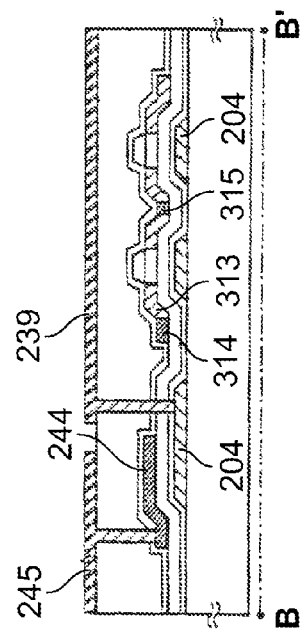

FIG. 6(A) is a sectional view of the pixel portion 306 along the line A-A' of FIG. 1. Further, FIGS. 6(B) and 6(C) are sectional views along the lines B-B' and C-C' of FIG. 1. FIG. 6(B) is a view illustrating a portion where the gate electrode 204 and the gate wiring 239 are contacted to each other. The gate electrode 204 serves as one electrode of the holding capacitor in the neighboring pixel, and is forming a capacitor at a portion overlapped on the semiconductor film 244 that is connected to the pixel electrode 245. FIG. 6(C) illustrates a relationship of arrangement among the source wiring 207, pixel electrode 240 and neighboring pixel electrode 246. An end of the pixel electrode is formed on the source wiring 207 to form an overlapped portion thereby to enhance the light-shielding performance by shutting off stray light. FIG. 3 shows an equivalent circuit of the above pixel. In this specification, the above substrate is referred to as active matrix substrate for convenience.

One of the advantages of forming the TFTs in an inverse staggering type is that the LDD region overlapped on the gate electrode in the n-channel TFT can be formed in a self-aligned manner by the back-surface exposure process, and the dispersion in the TFT characteristics can be minimized in addition to the feature of continuously forming the gate insulating film and the semiconductor film.

Embodiment 2

Figure 7:
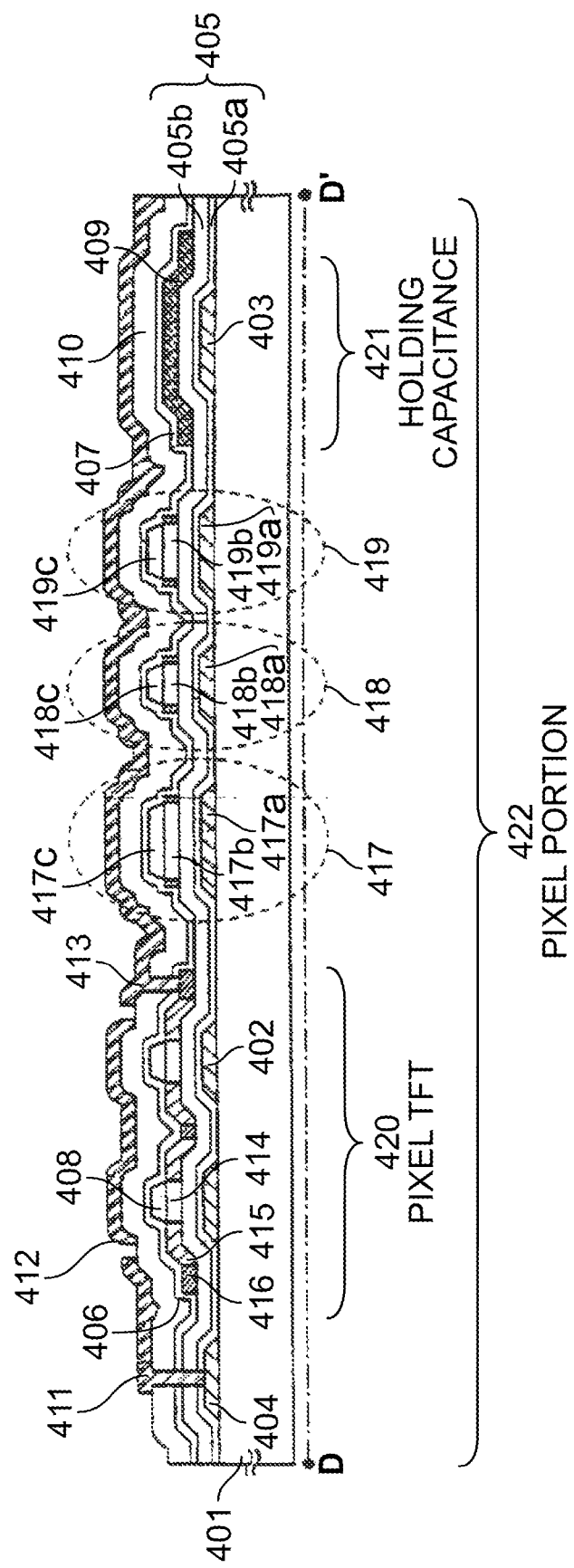
FIG. 7 is a sectional view illustrating the constitution of a pixel in a liquid crystal display device of the reflection type.
Figure 8:
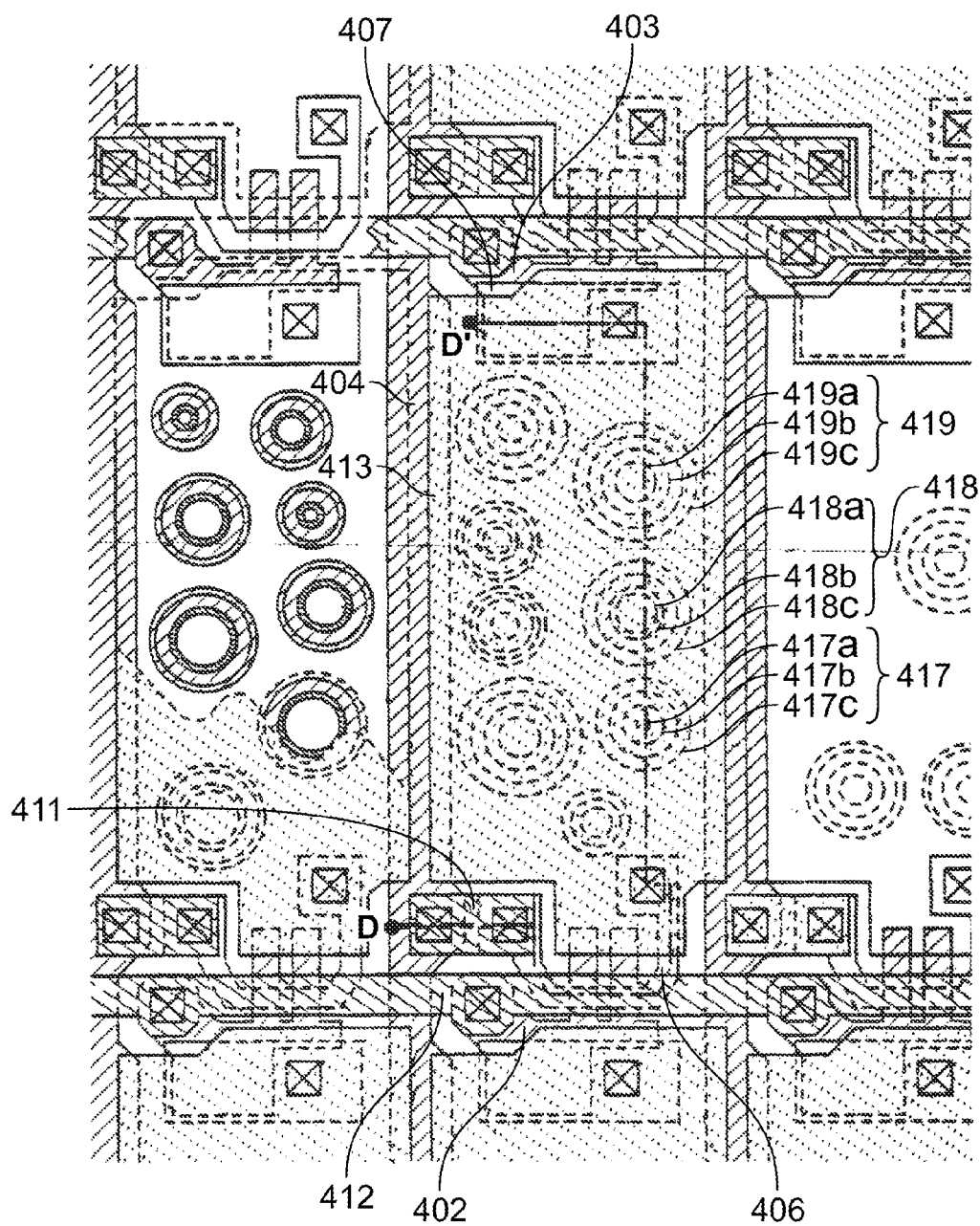
FIG. 8 is a top view illustrating the constitution of the pixel in the liquid crystal display device of the reflection type.

This embodiment deals with a pixel structure applied to a liquid crystal display device of the reflection type, which will now be described with reference to FIG. 8 which is a top view of the pixel and FIG. 7 which is a sectional view along the line D-D' in FIG. 8. In FIG. 7, a pixel TFT 420 in a pixel portion 422 includes a gate electrode 402, a first insulating film 405, a semiconductor film 406, a channel protection film 408, second insulating films 409, 410, a source wiring 404, a gate wiring 412, a connection wiring 411 and a pixel electrode 413 formed on a substrate 401. A holding capacitor 421 is constituted by a capacitor wiring 403, a semiconductor film 407 and the first insulating film 405 formed therebetween. The constitution thereof is the same as the pixel TFT 303 and the holding capacitor 304 shown in FIG. 6(A).

Island-like regions 417 to 419 are formed under the pixel electrode 413 of the pixel portion 422 to render the surface thereof rugged. In FIG. 7, three island-like regions are shown having sizes of 5 to 10 μm and maintaining a pitch of 10 to 20 μm. The island-like regions are constituted by first layers 417a to 419a formed by using the same film as the gate electrode 402, second layers 417b to 419b formed by the same layer as the semiconductor film 406, and third layers 417c to 419c formed by the same layer as the third insulating layer 408. These layers are formed by etching through separate steps and are, hence, formed to become narrower toward the upper layers with their ends not being in agreement with one another.

Second insulating films 409 and 410 are formed thereon. Here, the second insulating film 410 is formed of an organic resin material to reflect the ruggedness of the underlying layer. For this purpose, the second insulating film 410 is formed by applying an organic resin material having a viscosity of 10 to 1000 cp (preferably, 40 to 200 cp) so as to form ruggedness on the surface. Upon forming the layer of the organic resin material, the surface becomes rugged with a mild curvature of a radius of curvature of 0.1 to 4 μm. Though FIG. 8 shows island regions of a circular shape, the island regions are in no way limited to the above shape but may have any polygonal shape. Upon forming the pixels having the constitution as described above, mirror-surface reflection is prevented in the liquid crystal display device of the reflection type, and the quality of display can be improved, particularly, at the time of white display.

Embodiment 3

Figure 9:
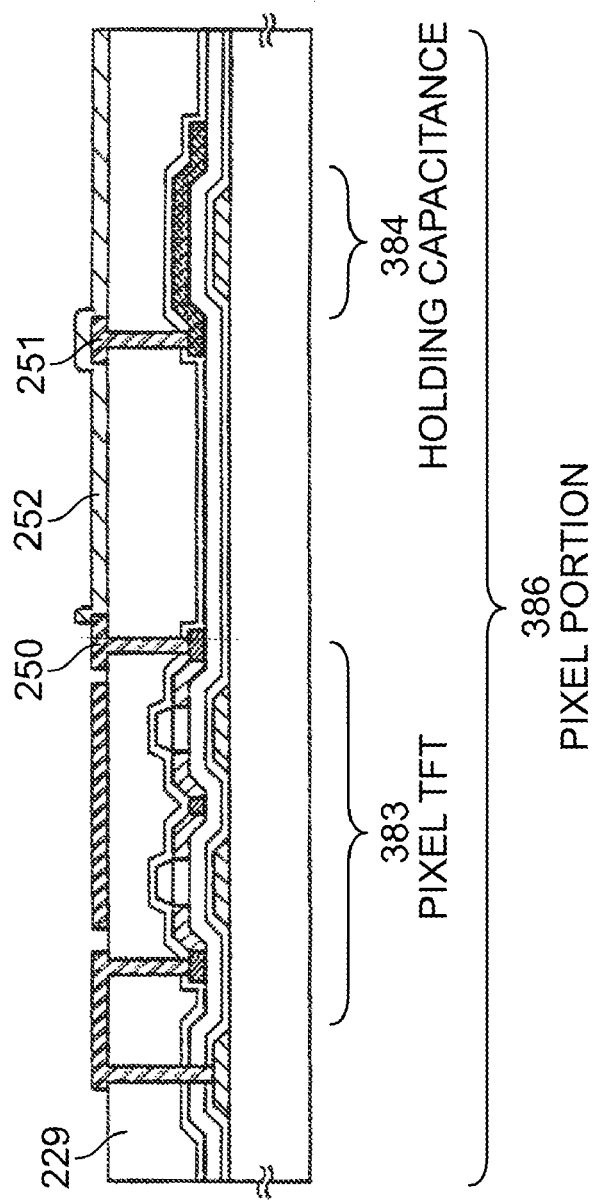
FIG. 9 is a sectional view illustrating the constitution of a pixel portion in a liquid crystal display device of the transmission type.

The embodiment 1 has dealt with the active matrix liquid crystal display device of the reflection type. By forming the pixel electrode using a transparent electrically conducting film, however, it is possible to form a display device of the transmission type. A pixel TFT 383 in a pixel portion 386 shown in FIG. 9 is fabricated in the same manner as the pixel TFT 303 described in the embodiment 1, and this embodiment describes concerning the differences only.

After a second layer 229 of the second insulating film is formed by using the organic resin material, first pixel electrodes 250 and 251 are formed simultaneously with the gate wiring and the connection electrode. The first pixel electrode 250 is connected to the semiconductor film of the pixel TFT 383, and the first pixel electrode 251 is connected to the semiconductor film forming the holding capacitor 384. Thereafter, a transparent electrically conducting film 252 is formed to form a pixel electrode.

The transparent electrically conducting film is formed by sputtering or vacuum-vaporizing indium oxide ($In_2O_3$) or an indium oxide-tin oxide ($In_2O_3$—$SnO_2$; ITO) alloy. The above material is etched by using a hydrochloric acid solution. Further, etching the ITO tends to produce residue. In order to improve workability by etching, therefore, there may be used an indium oxide-zinc oxide alloy ($In_2O_3$—$ZnO$). The indium oxide-zinc oxide alloy exhibits excellent surface smoothness and superior thermal stability to ITO. Similarly, zinc oxide (ZnO) is a preferred material, too. In order to improve transmission factor for visible light and electric conductivity, further, there can be used zinc oxide (ZnO:Ga) to which gallium (Ga) is added.

In the embodiment 1, the active matrix substrate was prepared by using 5 pieces of photomasks to fabricate a liquid crystal display device of the reflection type. However, by adding another piece of photomask (a total of 6 pieces of photomasks), as described above, there can be prepared an active matrix substrate that meets a liquid crystal display device of the transmission type.

Embodiment 4

Figure 10:
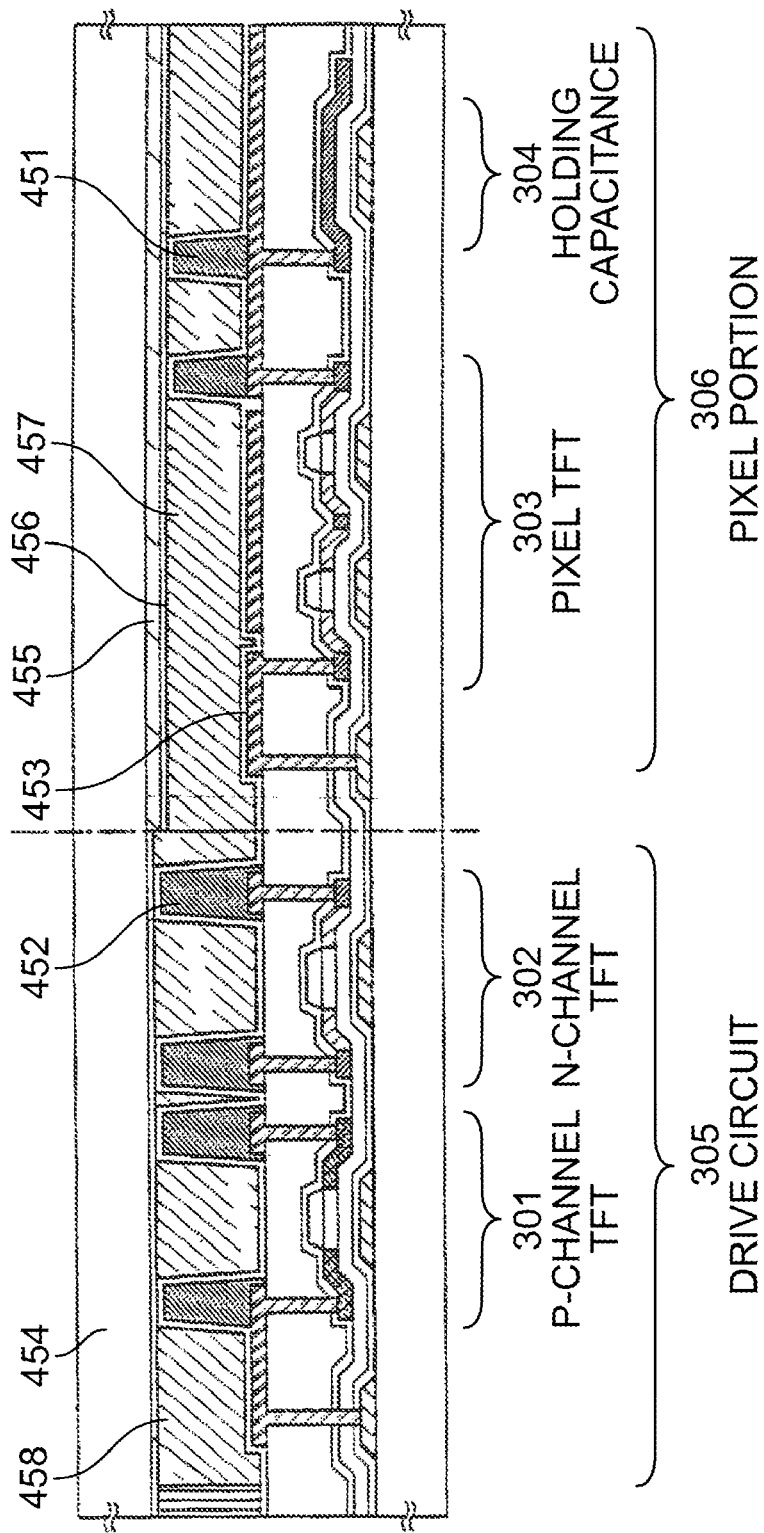
FIG. 10 is a sectional view illustrating the constitution of a liquid crystal display device.

This embodiment deals with the steps of fabricating an active matrix liquid crystal display device by using the active matrix substrate obtained in Embodiment 1. FIG. 10 illustrates a state where an active matrix substrate and an opposing substrate 454 are stuck to each other with a sealing member 458. First, pole-like spacers 451, 452 are formed on the active matrix substrate in the state of FIG. 6(A). The spacer 451 provided on the pixel portion is overlapped on a contact portion on the pixel electrode. The spacer has a height of 3 to 10 μm though it may vary depending upon the liquid crystal material that is used. In the contact portion, a recessed portion is formed to correspond to the contact hole. Upon forming the spacer to meet this portion, disturbance in the orientation of liquid crystals can be prevented. Thereafter, an orientation film 453 is formed followed by rubbing. A transparent electrically conducting film 455 and an orientation film 456 are formed on the opposing substrate 454. Thereafter, the active matrix substrate and the opposing substrate are stuck together, and liquid crystals are poured therein.

Figure 11:
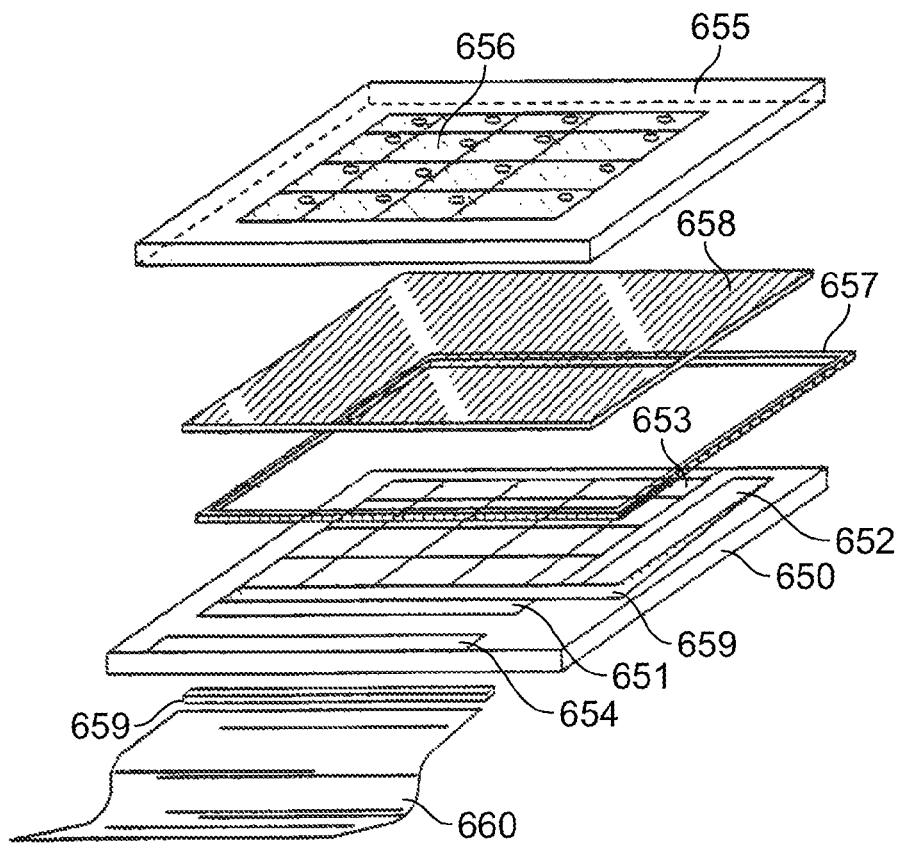
FIG. 11 is a view illustrating how to assemble the principal constituent elements of the liquid crystal display device.

FIG. 11 schematically illustrates the assembling by sticking the active matrix substrate and the opposing substrate together. On the active matrix substrate 650 have been formed a pixel portion 653, a drive circuit 652 on the scanning line side, a drive circuit 651 on the signal line side, an external input terminal 654, and a wiring 659 for connecting the external input terminals to the input units of the circuits. On the opposing substrate 655 are formed opposing electrodes 656 to correspond to the regions where the pixel portions and the drive circuits have been formed on the active matrix substrate 650. The active matrix substrate 650 and the opposing substrate 655 are stuck together via the sealing member 657, and liquid crystals are poured to form a liquid crystal layer 658 on the inside of the sealing member 657. Further, an FPC (flexible printed circuit board) 660 is stuck to the external input terminal 654 of the active matrix substrate 650. A reinforcing plate 659 may be provided to enhance the adhering strength of the FPC 660.

The thus fabricated liquid crystal display device of the active matrix type can be used as a display device for various electronic devices. Further, the method of fabricating the active matrix liquid crystal display device of this embodiment can similarly be applied even in fabricating the active matrix substrate of the embodiment 2 or of the embodiment 3.

Embodiment 5

Figure 12:
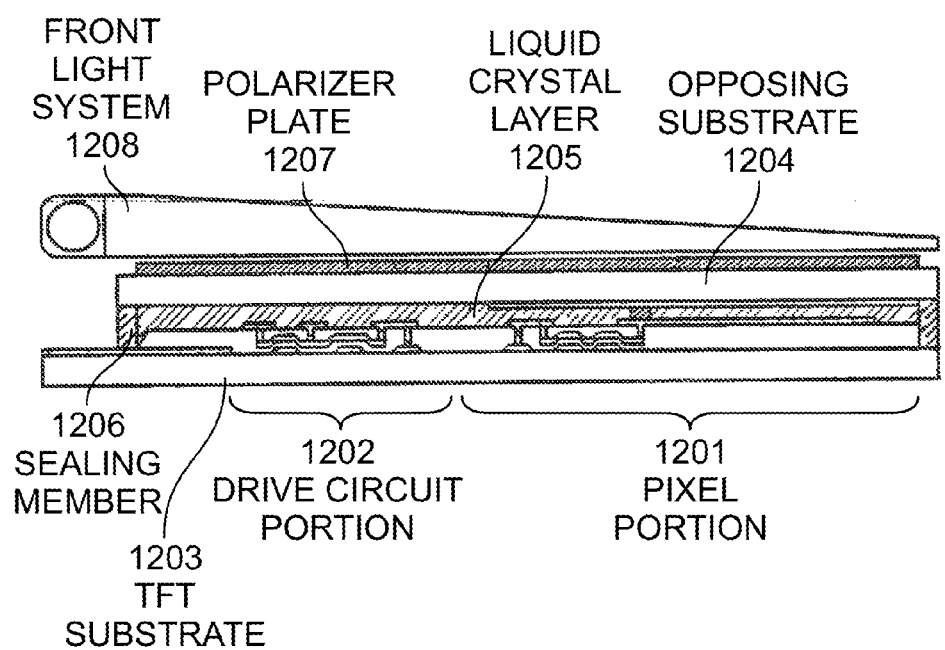
FIG. 12 is a view illustrating the constitution of a reflection type liquid crystal display device using a front light.

FIG. 12 illustrates an example of when the active matrix liquid crystal display device of the reflection type fabricated by using the pixel structure of this invention is used as a direct view-type display device. On the active matrix substrate 1203 are formed a pixel portion 1201 and a drive circuit portion 1202, an opposing substrate 1204 is adhered thereto with a sealing member 1206, and a liquid crystal layer 1205 is formed therebetween.

FIG. 12 illustrates the constitution of a liquid crystal display device of the reflection type using a front light and in which a front light system 1208 is provided on a polarizer plate 1207. In a bright place such as in the day time, the liquid crystal display device of the reflection type displays the picture by utilizing external light. When the external light cannot be introduced to a sufficient degree such as at night, the front light is used to produce the display. In any way, by employing the pixel structure of this invention, the pixel electrode occupies an increased ratio of the pixel portion and a bright display of picture is realized. When the front light is used, light of a small intensity suffices for the illumination making it possible to decrease the amount of electric power consumed by an electronic device in which the liquid crystal display device is incorporated. The constitution of this embodiment can be applied to the active matrix liquid crystal display device fabricated in the embodiment 4.

Embodiment 6

This embodiment deals with the case where the active matrix substrate of the embodiment 1 is applied to a self-light-emitting display device by using an electro luminescence (EL) material (hereinafter referred to as EL display device). The electro luminescence material emits light by either fluorescence or phosphorescence. The emission of light referred to in this embodiment includes either one of them or both of them.

FIG. 13 is a sectional view of the pixel portion in which there are formed a switching TFT 701, a current-controlling TFT 702 and a holding capacitor 703. These TFTs are formed through the same steps as those of the embodiment 1. The switching TFT 701 is an n-channel TFT, and has a channel-forming region 704, an LDD region 705 and a source or drain region 706 formed in a semiconductor film 755 on a gate electrode 751. The semiconductor film 755 is connected to a source wiring 753 through a connection electrode 761.

The current-controlling TFT 702 is a p-channel TFT, and has a channel-forming region 707 and a source or drain region 708 in a semiconductor film 756 on a gate electrode 752. The source side of the current-controlling TFT 702 is connected to a power source line 764, and the drain side thereof is connected to a drain electrode 765. To the drain electrode 765 is connected a pixel electrode 766 which is formed of a transparent electrically conducting film. Further, a holding capacitor 703 is formed in a region where the capacitor wiring 752 and the semiconductor film 756 are overlapped one upon the other.

The first insulating films 754 (754a, 754b) and second insulating films 759, 760 are the same as those of the embodiment 1.

Figure 14:
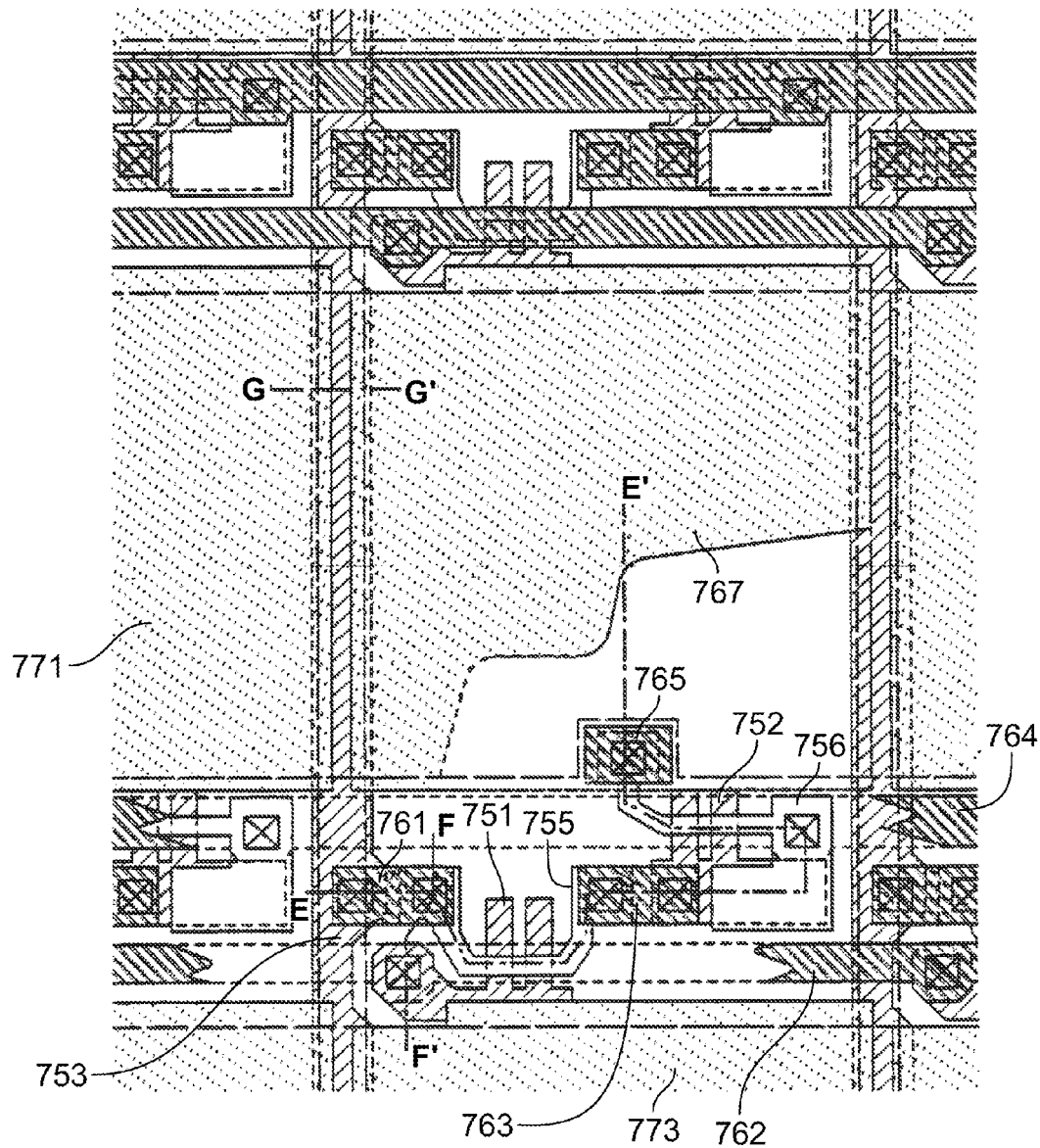
FIG. 14 is a top view illustrating the constitution of the pixel portion in the EL display device.

FIG. 13(A) is a sectional view along the line E-E' in FIG. 14. FIGS. 13(B) and 13(C) are sectional views along the line F-F' and G-G' in FIG. 14, FIG. 13(B) illustrating a portion where a gate electrode 751 of the switching TFT 701 is contacting to the gate wiring 772, and FIG. 13(C) illustrating a relationship of arrangement among the source wiring 753, the pixel electrode 767 and the neighboring pixel electrode 771, an end of the pixel electrode being formed on the source wiring 753 to form an overlapped portion thereby to enhance the light-shielding performance.

In the pixel portion, there is formed a bank 767 which is an insulating film covering an end of the pixel electrode which is an anode, and an organic compound layer is formed thereon to produce electroluminescence. By applying the solution, there are formed a light-emitting layer of such a material as polyvinyl carbazole and organic compound layers 768, 769 inclusive of an electron-pouring layer of potassium acetyl acetonate (hereinafter referred to as acac K). A cathode 770 formed of an aluminum alloy is formed thereon. In this case, the cathode 770 also works as a passivation film. Thus, there is formed a self-light-emitting EL element comprising an anode, an organic compound layer and a cathode. In the case of this embodiment, light emitted from the light-emitting layer 768 travels toward the active matrix substrate.

Upon employing the pixel structure of this invention as described above, it is allowed to improve the numerical aperture of the self-light-emitting display device of the active matrix type, too. As a result, the picture is displayed brightly and vividly.

Embodiment 7

This embodiment deals with a semiconductor device incorporating the display device of this invention. Examples of the semiconductor device of this type include portable data terminals (electronic notebook, mobile computer, cell phone, etc.), video camera, still camera, personal computer, TV and the like as shown in FIGS. 15 and 16.

Figure 15A:
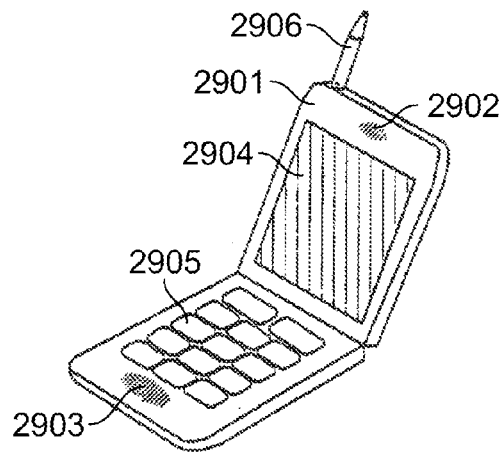
FIGS. 15(A) to 15(E) are views illustrating examples of the semiconductor device.

FIG. 15(A) illustrates a cell phone constituted by a main body 2901, a voice output unit 2902, a voice input unit 2903, a display device 2904, an operation switch 2905 and an antenna 2906. This invention can be applied to the display device 2904. In particular, the liquid crystal display device of the reflection type of the embodiment 5 is suited from the standpoint of decreasing the consumption of electric power.

Figure 15B:
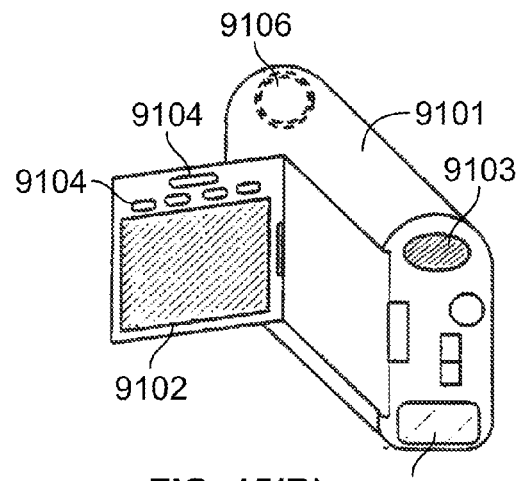

FIG. 15(B) illustrates a video camera constituted by a main body 9101, a display device 9102, a voice input unit 9103, an operation switch 9104, a battery 9105 and an imaging portion 9106. This invention can be applied to the display device 9102. In particular, the liquid crystal display device of the reflection type of the embodiment 5 is suited from the standpoint of decreasing the consumption of electric power.

Figure 15C:
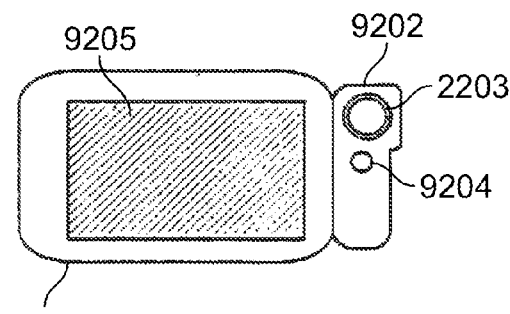

FIG. 15(C) illustrates a mobile computer or a portable data terminal constituted by a main body 9201, a camera portion 9202, an imaging portion 9203, an operation switch 9204 and a display device 9205. This invention can be applied to the display device 9205. In particular, the liquid crystal display device of the reflection type of the embodiment 5 is suited from the standpoint of decreasing the consumption of electric power.

Figure 15D:
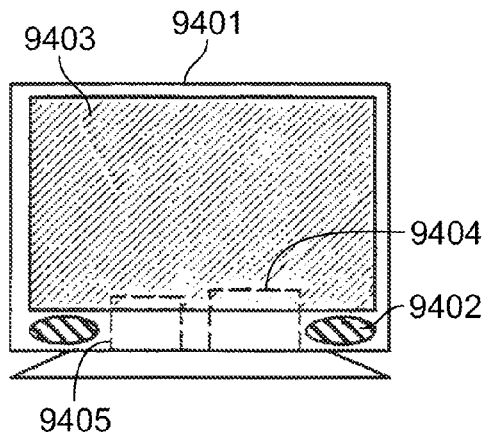

FIG. 15(D) illustrates a receiver unit constituted by a main body 9401, a speaker 9402, a display device 9403, a receiver unit 9404 and an amplifier unit 9405. This invention can be applied to the display device 9403. In particular, the liquid crystal display device of the reflection type of the embodiment 5 is suited from the standpoint of decreasing the consumption of electric power.

Figure 15E:
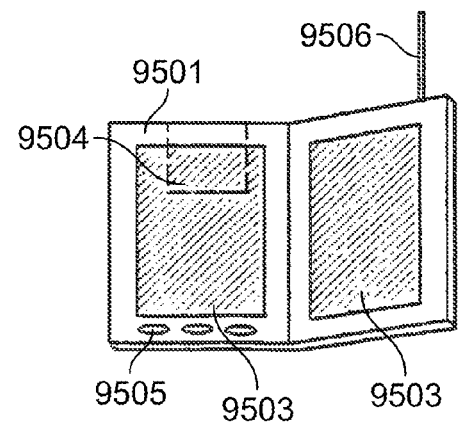

FIG. 15(E) illustrates an electronic book constituted by a main body 9501, display devices 9502, 9503, a storage medium 9504, an operation switch 9505, and an antenna 9506. The electronic book displays the data stored in a mini-disk (MD) or in a DVD and the data received by the antenna. As the direct view type display deices 9502 and 9503, in particular, the liquid crystal display device of the reflection type of the embodiment 5 is suited from the standpoint of decreasing the consumption of electric power.

Figure 16A:
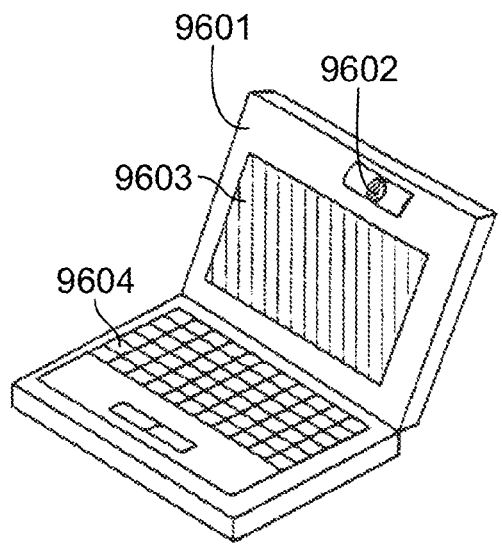
FIGS. 16(A) to 16(C) are views illustrating examples of the semiconductor device.

FIG. 16(A) illustrates a personal computer which is constituted by a main body 9601, a picture input unit 9602, a display device 9603 and a keyboard 9604. This invention can be applied to the display device 9603. In particular, the liquid crystal display device of the reflection type of the embodiment 5 is suited from the standpoint of decreasing the consumption of electric power.

Figure 16B:
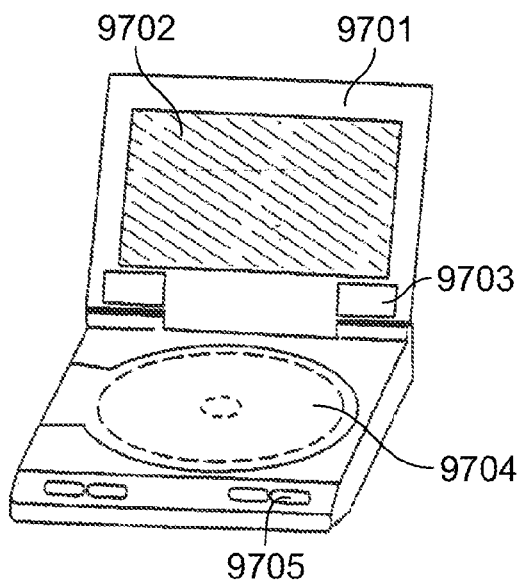

FIG. 16(B) illustrates a player which uses a recording medium recording a program (hereinafter called recording medium) and is constituted by a main body 9701, a display device 9702, a speaker unit 9703, a recording medium 9704 and an operation switch 9705. This device uses a DVD (digital versatile disk) and a CD as recording media, and can be used for appreciating music, appreciating movies, enjoying games and internet. This invention can be applied to the display device 9702. In particular, the liquid crystal display device of the reflection type of the embodiment 5 is suited from the standpoint of decreasing the consumption of electric power.

Figure 16C:
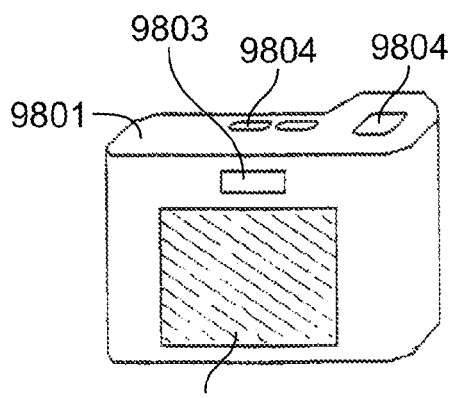

FIG. 16(C) illustrates a digital camera which is constituted by a main body 9801, a display device 9802, an eyepiece 9803, an operation switch 9804 and an imaging portion (not shown). This invention can be applied to the display device 9802. In particular, the liquid crystal display device of the reflection type of the embodiment 5 is suited from the standpoint of decreasing the consumption of electric power.

The pixel structure of the present invention enables the pixel electrode to occupy an increased proportion of the pixel portion and, hence, makes it possible to improve the numerical aperture in the active matrix liquid crystal display device of the reflection type. As a result, the picture can be brightly and vividly displayed at any portion of the liquid crystal display device of the reflection type.

What is claimed is:
1. A semiconductor device comprising:
    a gate electrode and a source wiring formed over an insulating surface;
    a first insulating film formed over the gate electrode and the source wiring;

a semiconductor film formed over the first insulating film;
wherein the semiconductor film comprising a channel region, a source region and a drain region,
a source electrode formed over the first insulating film; and
a first electrode formed over the first insulating film;
a second insulating film formed over the first electrode;
a pixel electrode formed over the first insulating film;
a second electrode formed over the second insulating film;
wherein the source electrode is electrically connected to the source region and wherein the source electrode is electrically connected to the source wiring through at least an opening in the first insulating film, and
wherein the pixel electrode is electrically connected to the drain region,
wherein the second electrode is electrically connected to the drain region,
wherein the first electrode is overlapped with the second electrode.

2. A semiconductor device according to claim 1, wherein the gate electrode and the source wiring contains a same material.

3. A semiconductor device according to claim 1, wherein a portion of the pixel electrode is overlapped with the source wiring.

4. A semiconductor device according to claim 1, wherein the first insulating film includes at least silicon nitride.

5. A semiconductor device according to claim 1, further comprising a liquid crystal layer over the pixel electrode.

6. A semiconductor device according to claim 1, further comprising an organic light-emitting layer over the pixel electrode.

7. A semiconductor device according to claim 1, wherein the pixel electrode has a conducting layer comprising aluminum or silver as a main component of a surface.

8. A semiconductor device according to claim 1, wherein a gate wiring formed over the insulating film is electrically connected to the gate electrode.

9. A semiconductor device according to claim 8, wherein the gate wiring covers the semiconductor film to function as a light-shielding film to the semiconductor film.

10. A semiconductor device according to claim 1, wherein the source region and the drain region are formed to introduce an impurity to the semiconductor film.

11. A semiconductor device according to claim 1, wherein the second electrode and the pixel electrode contain a same material.

12. A semiconductor device comprising:
a gate electrode and a source wiring formed over an insulating surface;
an insulating film formed over the gate electrode and the source wiring;
a semiconductor film formed over the insulating film; wherein the semiconductor film comprising a channel region, a source region and a drain region,
a source electrode formed over the insulating film;
a pixel electrode formed over the insulating film; and
a gate wiring formed over the insulating film;
wherein the source electrode is electrically connected to the source region;
wherein the source electrode is electrically connected to the source wiring through at least an opening in the insulating film,
wherein the pixel electrode is electrically connected to the drain region, and
wherein the gate wiring is electrically connected to the gate electrode.

13. A semiconductor device according to claim 12, wherein the gate electrode and the source wiring contains a same material.

14. A semiconductor device according to claim 12, wherein a portion of the pixel electrode is overlapped with the source wiring.

15. A semiconductor device according to claim 12, wherein the insulating film includes at least silicon nitride.

16. A semiconductor device according to claim 12, further comprising a liquid crystal layer over the pixel electrode.

17. A semiconductor device according to claim 12, further comprising an organic light-emitting layer over the pixel electrode.

18. A semiconductor device according to claim 12, wherein the pixel electrode has a conducting layer comprising aluminum or silver as a main component of a surface.

19. A semiconductor device according to claim 12, wherein the gate wiring covers the semiconductor film to function as a light-shielding film to the semiconductor film.

20. A semiconductor device according to claim 12, wherein the source region and the drain region are formed to introduce an impurity to the semiconductor film.

21. A semiconductor device according to claim 12, wherein the gate wiring is overlapped with the source wiring.

22. A semiconductor device comprising:
a gate electrode, a source wiring and a first electrode formed over an insulating surface;
an insulating film formed over the gate electrode, the source wiring and the first electrode;
a semiconductor film formed over the insulating film; wherein the semiconductor film comprising a channel region, a source region and a drain region,
a second electrode formed over the insulating film;
a source electrode formed over the insulating film; and
a pixel electrode formed over the insulating film;
wherein the source electrode is electrically connected to the source region;
wherein the source electrode is electrically connected to the source wiring through at least an opening in the insulating film,
wherein the pixel electrode is electrically connected to the drain region,
wherein the second electrode is electrically connected to the drain region, and
wherein the first electrode is overlapped with the second capacitor electrode to form a capacitor.

23. A semiconductor device according to claim 22, wherein the gate electrode, the source wiring and the first capacitor electrode contain a same material.

24. A semiconductor device according to claim 22, wherein a portion of the pixel electrode is overlapped with the source wiring.

25. A semiconductor device according to claim 22, wherein the insulating film includes at least silicon nitride.

26. A semiconductor device according to claim 22, further comprising a liquid crystal layer over the pixel electrode.

27. A semiconductor device according to claim 22, further comprising an organic light-emitting layer over the pixel electrode.

28. A semiconductor device according to claim 22, wherein the pixel electrode has a conducting layer comprising aluminum or silver as a main component of a surface.

29. A semiconductor device according to claim 22, wherein a gate wiring formed over the insulating film is electrically connected to the gate electrode.

30. A semiconductor device according to claim 29, wherein the gate wiring covers the semiconductor film to function as a light-shielding film to the semiconductor film.

31. A semiconductor device according to claim 22, wherein the source region and the drain region are formed to introduce an impurity to the semiconductor film.

* * * * *

UNITED STATES PATENT AND TRADEMARK OFFICE
CERTIFICATE OF CORRECTION

PATENT NO. : 8,178,880 B2  
APPLICATION NO. : 12/837117  
DATED : May 15, 2012  
INVENTOR(S) : Shunpei Yamazaki and Yasuyuki Arai Page 1 of 1

It is certified that error appears in the above-identified patent and that said Letters Patent is hereby corrected as shown below:

Column 2, line 22, replace "shutoff" with --shut off--;

Column 14, line 50, in claim 22 before "electrode" delete "capacitor".

Signed and Sealed this  
Twenty-first Day of August, 2012

David J. Kappos  
*Director of the United States Patent and Trademark Office*